United States Patent

Yuuki

[11] Patent Number: 5,810,929
[45] Date of Patent: Sep. 22, 1998

[54] PYROGENIC WET THERMAL OXIDATION OF SEMICONDUCTOR WAFERS

[75] Inventor: Tomohiro Yuuki, Hamamatsu, Japan

[73] Assignee: Yamaha Corporation, Hamamatsu, Japan

[21] Appl. No.: 690,531

[22] Filed: Jul. 31, 1996

Related U.S. Application Data

[62] Division of Ser. No. 279,738, Jul. 22, 1994, Pat. No. 5,633,212.

[30] Foreign Application Priority Data

Jul. 24, 1996 [JP] Japan ......................... 5-44645

[51] Int. Cl.[6] ................................. C23C 16/00
[52] U.S. Cl. .................... 118/697; 118/704; 118/715; 118/719; 118/724; 118/725
[58] Field of Search ..................... 437/239; 118/715, 118/724, 725, 719, 697, 704

[56] References Cited

U.S. PATENT DOCUMENTS

| | | | |
|---|---|---|---|
| 3,930,908 | 1/1976 | Jolly | 118/715 |
| 4,154,192 | 5/1979 | Tsubouchi et al. | 118/49.1 |
| 4,217,154 | 8/1980 | Popp et al. | 148/189 |
| 4,376,796 | 3/1983 | Arrasmith et al. | 427/82 |
| 4,599,247 | 7/1986 | Bean et al. | 427/93 |
| 4,717,596 | 1/1988 | Barbee | 118/715 |
| 4,906,595 | 3/1990 | van der Plas et al. | 437/239 |
| 4,911,638 | 3/1990 | Bayne et al. | 432/152 |
| 5,154,949 | 10/1992 | Shindo et al. | 427/253 |
| 5,186,120 | 2/1993 | Ohnishi | 118/715 |
| 5,234,501 | 8/1993 | Nakao et al. | 118/719 |
| 5,257,926 | 11/1993 | Drimer et al. | 431/154 |
| 5,359,148 | 10/1994 | Okase et al. | 118/724 |
| 5,388,944 | 2/1995 | Takanabe et al. | 414/217 |

OTHER PUBLICATIONS

Sherman, Chemical Vapor Deposition for Microelectronics, Noyes Publications, Park Ridge, N.J., ®1987, pp. 150–151.
Webster's New Collegiate Dictionary, G & C Merriam Co., Springfeild, Mass. ®1975, pp. 240, 320.

*Primary Examiner*—Richard Bueker
*Attorney, Agent, or Firm*—Pillsbury Madison & Sutro

[57] ABSTRACT

An oxidizing gas containing water vapor generated by hydrogen combustion is introduced from an external gas burner via gas supply pipes into the upper space of a process tube surrounded by a heater, and exhausted from the lower part of the process tube. Until the flame of hydrogen burnt in the external gas burner becomes stable, a dilute gas such as $N_2$ is introduced into the upper space of the process tube via other gas supply pipes so as to suppress the initial oxidation. Suppressing the initial oxidation may also be performed by bypassing an oxidizing gas from the external gas burner to an exhaust system while introducing a non-oxidizing gas such as $N_2$ into the upper space of the process tube.

26 Claims, 8 Drawing Sheets

FIG. 9

| STEP | | SET VALUE OF TEMP | TIME | SET VALUE OF GAS VOLUME | | | |
|---|---|---|---|---|---|---|---|
| | | | | DILUTE N2 | PURGE N2 | H2 | O2 |
| BOAT UNLOAD | | 800°C | 6min | — | 20 l/min | — | 0.2 l/min |
| BOAT COOL | | | 10min | — | 20 l/min | — | 0.2 l/min |
| WAFER CHANGE | | | 18min30sec | — | 20 l/min | — | 0.2 l/min |
| BOAT LOAD | | | 24min | — | 20 l/min | — | 0.2 l/min |
| PREHEAT | | | 30min | — | 10 l/min | — | 0.1 l/min |
| | t1~t2 | | 1min47sec | — | 10 l/min | — | — |
| | t2~t3 | | 13sec | — | 10 l/min | — | SLOW START—INCREASE FLOW RATE |
| | t3~t4 | | 10sec | 0~20 l/min | — | — | 3 l/min |
| PYROGENIC COMBUSTION | t4~t5 | | 10sec | 20 l/min | — | SLOW START PERIOD | 3 l/min |
| | t5~t6 | | 9.9sec | 20 l/min | — | INCREASE FLOW RATE | 3 l/min |
| | t6~t7 | | 30sec | 20 l/min | — | 3 l/min | 3 l/min |
| | t7~t8 | | 10sec | 20 l/min | — | INCREASE FLOW RATE TO A SET VALUE | INCREASE FLOW RATE TO A SET VALUE |
| WET OXIDATION | t8~ | | 6min | — | — | 10 l/min | 10 l/min |
| PYROGENIC EXTINGUISHMENT(1) | | | 13sec | — | 2 l/min | 10 l/min | 10 l/min |
| PYROGENIC EXTINGUISHMENT(2) | | | 1min | — | 2 l/min | — | 10 l/min |
| POST ANNEAL | | | 15min | — | 10 l/min | — | — |
| BOAT UNLOAD | | | 18min | — | 20 l/min | — | — |
| BOAT COOL | | | 10min | — | 20 l/min | — | — |
| WAFER DISCHARGW | | | 18min30sec | — | 20 l/min | — | — |
| BOAT LOAD | | | 6min | — | 20 l/min | — | — |

PYROGENIC WET THERMAL OXIDATION OF SEMICONDUCTOR WAFERS

This is a divisional of application Ser. No. 08/279,738, filed Jul. 22, 1994 now U.S. Pat. No. 5,633,212.

BACKGROUND OF THE INVENTION a) Field of the Invention

The present invention relates to an oxidation process for semiconductor wafers, and more particularly to a thermal oxidation process for semiconductor wafers.

b) Description of the Related Art

A vertical type thermal treatment furnace such as shown in FIGS. 6 and 7 is known in which semiconductor wafers are subjected to a wet oxidation process.

A wet oxidation process is an oxidation process to be performed in an atmosphere containing water vapor, commonly using a mixed gas of water vapor and oxygen. In contrast thereto, a dry oxidation process is an oxidation process to be performed in a gaseous atmosphere containing only oxygen or oxygen arid an inert gas. In place of a method of generating a gas containing water vapor by bubbling the gas in pure water, a method of generating a gas containing water vapor by burning hydrogen in an oxygen gas has been used recently.

In FIGS. 6 and 7, reference numeral 10 represents a process tube disposed upright which is made of, for example, a circular quartz tube. Although the top of the process tube 10 is closed, the top is shown broken in FIG. 6 so as to expose the interior or the process tube 10.

Two gas supply pipes 12a and 12b made of quartz and branched from a lower gas supply pipe 12 extend upward along the side wall of the process tube 10. The gas supply pipe 12 is coupled to an external gas burner 14.

The external gas burner 14 is supplied with hydrogen $H_2$ and oxygen $O_2$, and burns the hydrogen to generate oxidizing gas containing water vapor. The oxidizing gas is introduced into the upper space of the process tube 10 via the gas supply pipes 12a and 12b.

A gas exhaust pipe 16 is provided at the lower portion of the process tube 10. The gas introduced into the process tube 10 is exhausted from the exhaust pipe 10 to an exhaust or evacuation system as an exhaust gas G. As shown in FIG. 7, a heater 18 is mounted surrounding the gas supply pipes 12a and 12b and process tube 10.

In operation, semiconductor wafers WF supported by a wafer holder (not shown) are transported into the process tube 10 from the bottom thereof. The bottom of the tube 10 is closed by a lid formed integrally with the wafer holder. A wet oxidation process is featured by a fast oxidation speed, a small defect density, and other good oxide properties. For example, in the case of a MOS/IC, this process is used for forming a field oxide film, a gate oxide film, or the like.

With the vertical type heat treatment furnace described above, $O_2$ is introduced into the external gas burner 14 and thereafter, $H_2+O_2$ are introduced. $H_2$ is then burnt so that an oxidizing gas containing $O_2$, and water vapor; is supplied to the furnace. In this case, it takes about one minute to stabilize an oxygen flame after $O_2$ was introduced into the furnace. During this period, partial pressures of the gas contents oxygen, water vapor, hydrogen) are unstable. Therefore, wafers are exposed in an unstable atmosphere while forming an initial oxide film where an oxidation speed is relatively fast, resulting in an increased variation of oxide film thickness and a lowered reproducibility. It is difficult to form an oxide film, particularly a very thin oxide film, at high yield.

SUMMARY OF THE INVENTION

It is an object of the present invention to provide a novel vertical type heat treatment furnace capable of reducing a variation of oxide film thickness.

According to one aspect of the present invention, there is provided a method of manufacturing a semiconductor device, using a furnace system including a main furnace chamber and an external combustion chamber connected to the main furnace chamber at an upstream thereto comprising the steps of: (a) purging the furnace system with an inert gas; (b) loading semiconductor wafers into the main furnace chamber; (c) activating a heater in the external combustion chamber; (d) introducing oxygen into the furnace system; (e) stopping purging the inert gas while providing dilute gas into the main furnace chamber without passing through the external combustion chamber; (f) introducing hydrogen into the furnace system with a predetermined amount while maintaining introducing oxygen; (g) stopping the heater; and (h) raising flow rates of oxygen and hydrogen to desired level while stopping providing the dilute gas.

According to another aspect of the present invention, there is provided a method of oxidizing a semiconductor substrate using a furnace system including a main furnace, a sub-furnace, a first valve connected between the main furnace and the sub-furnace, and a second valve connected to the sub-furnace to exhaust gas from the sub-furnace, comprising the steps of: (a) purging the furnace system with an inert gas supplied to the sub-furnace; (b) loading the semiconductor substrate into a main furnace; (c) activating a heater provided in the sub-furnace; (d) introducing oxygen into the sub-furnace while opening the second valve and closing the first valve; (e) simultaneously with the step (d), stopping purging the inert gas while providing dilute gas into the main furnace; (f) following the step (e), introducing hydrogen into the sub-furnace with a predetermined amount while maintaining introducing oxygen; (g) stopping the heater; and (h) raising flow rates of oxygen and hydrogen to desired level while stopping providing dilute gas.

An oxidizing gas is diluted by a dilute gas or by-passed until a hydrogen flame is stabilized after hydrogen was introduced into the heat treatment furnace. Therefore, an initial oxidation of wafers can be suppressed. Wet oxidation starts after the hydrogen flame has been stabilized so that a variation of oxide film thickness can be reduced, resulting in an improved reproducibility and an improved yield of oxide films, particularly very thin oxide films.

BRIEF DESCRIPTION OF THE DRAWINGS

FIG. 9 is a diagram showing an oxidation sequence.

DETAILED DESCRIPTION OF THE PREFERRED EMBODIMENTS

Figure 1:
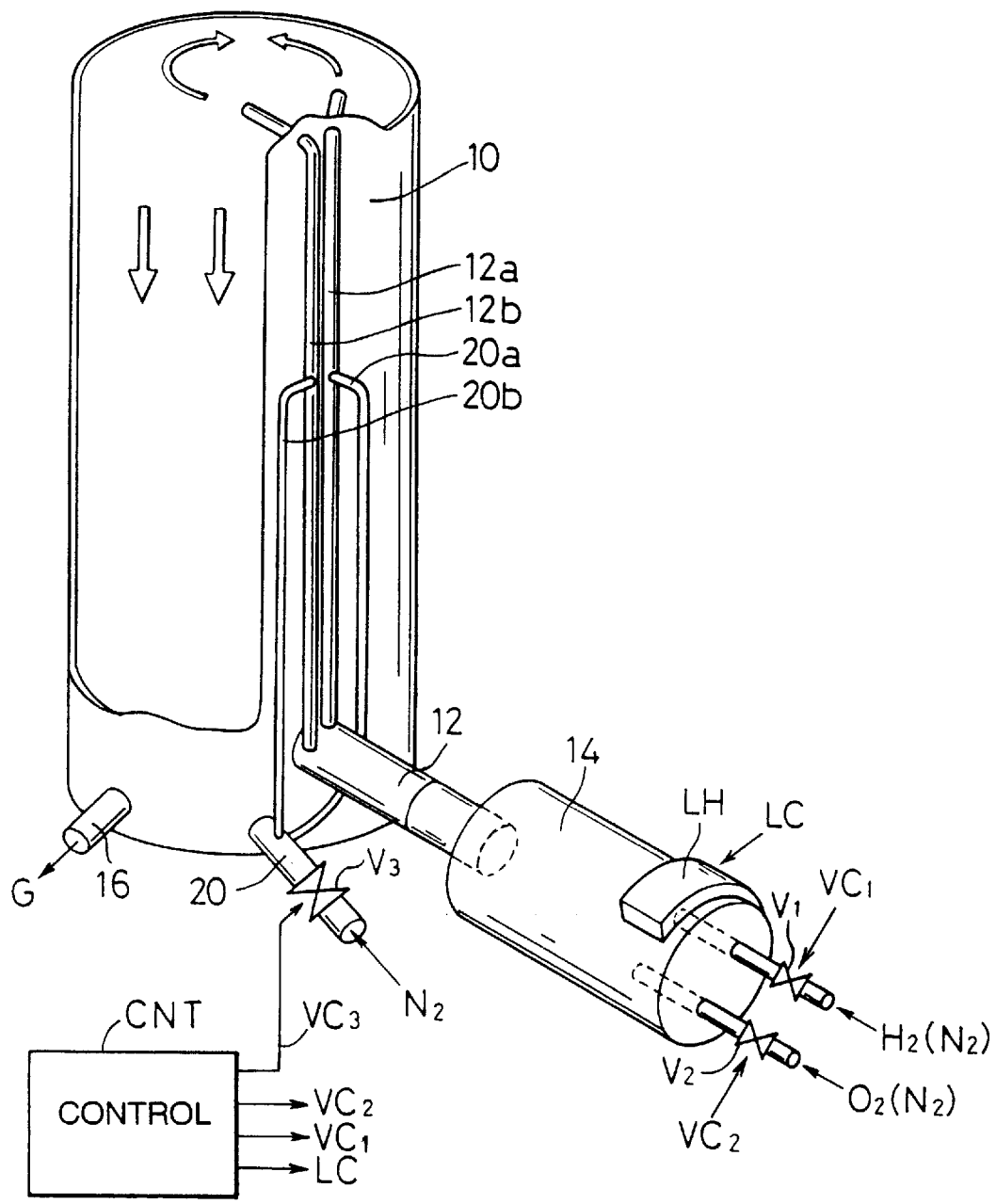
FIG. 1 is a partially broken perspective view of a vertical type heat treatment furnace according to a first embodiment of the invention.
Figure 6:
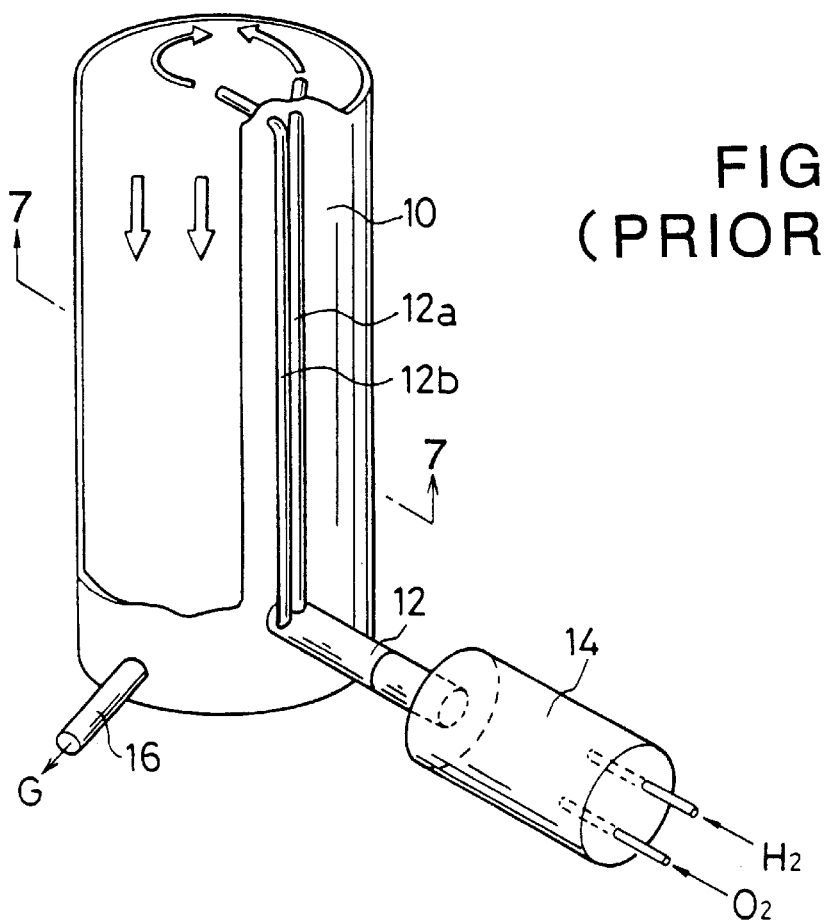
FIG. 6 is a partially broken perspective view of an example of a conventional vertical type heat treatment furnace.
Figure 7:
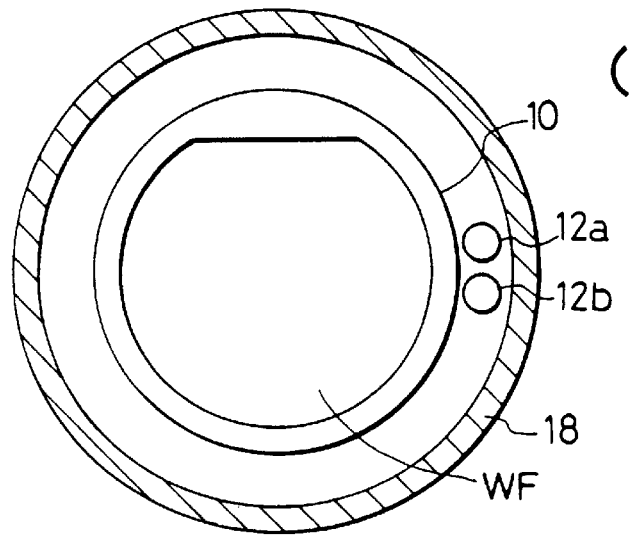
FIG. 7 is a cross sectional view taken along line X—X' of FIG. 6.

FIG. 1 shows a vertical type heat treatment furnace to be used by the first embodiment of the invention. Like elements to those shown in FIGS. 6 and 7 are represented by using identical reference numerals, and the detailed description thereof is omitted. Although a heater similar to that shown in FIG. 7 is provided, it is not shown in FIG. 1.

$H_2$ or $N_2$ is introduced from a gas source pipe having a control valve V1 into an external gas burner 14 or combustion chamber, and $O_2$ or $N_2$ is introduced from another gas source pipe having a control valve V2 into the burner 14. The external gas burner 14 may be of a light converging and heating type. This type has an SiC heat converging plate in front of the $H_2$ gas source pipe, the plate being heated by an infrared lamp heater LH.

A pair of gas supply pipes 12a and 12b bifurcated from a lower gas supply pipe 12 and extending upward, each, is connected to a pair of gas supply pipes 20a and 20b bifurcated from another gas supply pipe 20 into which a non-oxidizing dilute gas $N_2$ is supplied via a control valve V3. Thus, the external gas burner is connected to the upstream of the heat treatment furnace with intervening confluences. The non-oxidizing dilute gas $N_2$ may be replaced with Ar or He.

A controller CNT controls the temperature of the furnace, a gas supply to the furnace, and the like, and generates control signals VC1 to VC3 for controlling the control valves V1 to V3, a control signal LC for controlling the lamp heater LH, and other signals.

Figure 2:
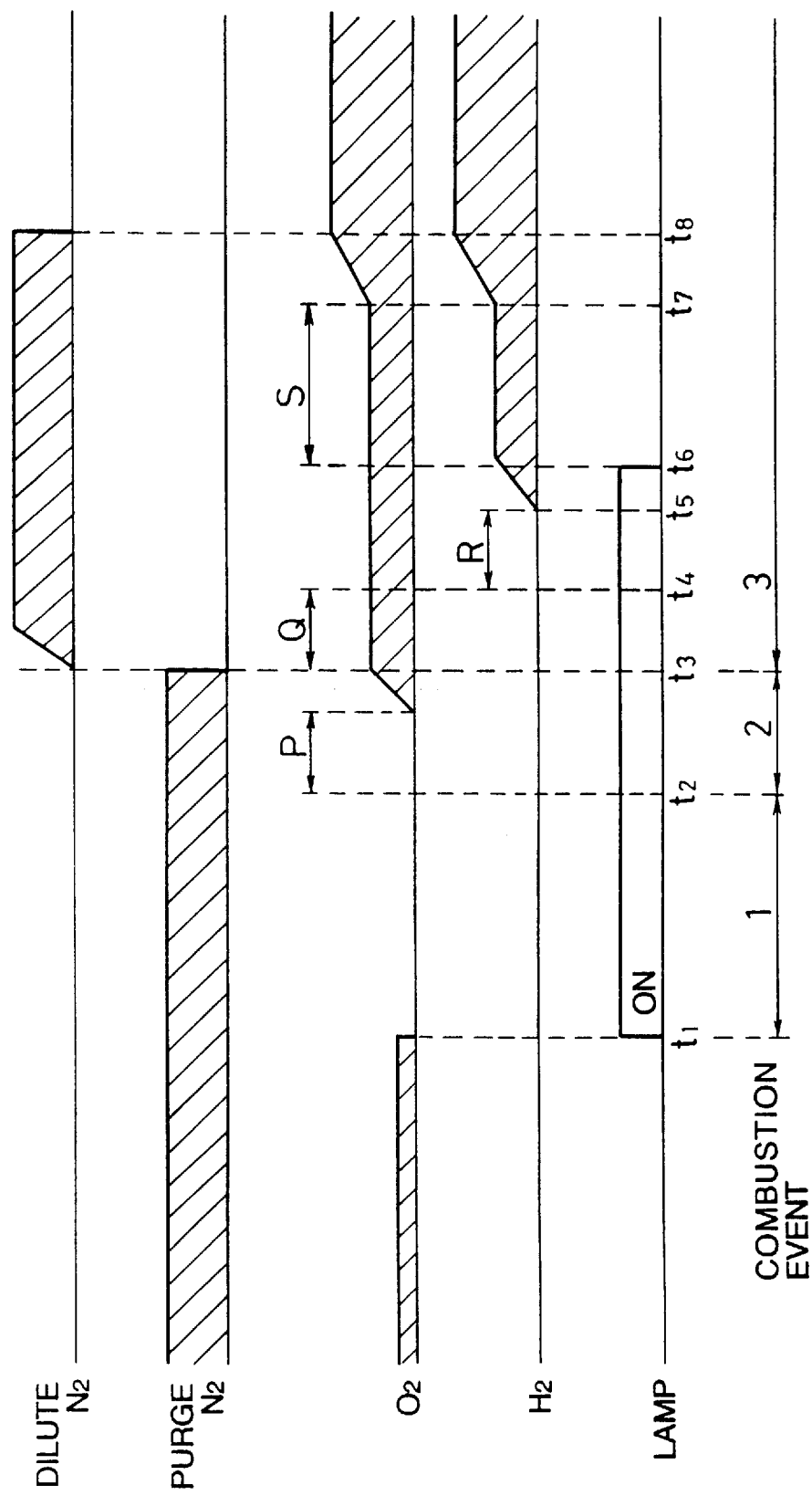
FIG. 2 is a timing chart explaining the control sequence of an oxidation process of the first embodiment.

Next, the control sequence of an oxidation process using the furnace shown in FIG. 1 will be described with reference to FIG. 2.

First, purging the inside of the combustion chamber of the external gas burner 14 and the process tube 10 by mainly $N_2$ starts by opening the valve V2. A combustion event starts at time t1. Combustion events 1 and 2 continue for 1 minute and 47 seconds and for 13 seconds, respectively. At the time t1, the lamp heater LH is turned on by supplying the control signal LC thereto so that the heat converging plate is heated to 800° C. At time t2, the combustion event 1 is terminated, and the combustion event 2 starts.

After a slow start period P of 10 sec after the time t2, the control valve V2 is opened in response to the control signal VC2 so as to purge the inside of the combustion chamber by $O_2$.

The slow start period P is provided for the following reason. The gas supply system from the gas source to the reaction furnace has two valves, a control valve, i.e., a piezo valve or a needle valve of a mass flow controller (MFC) and a diaphragm air valve. A flow rate is generally controlled only by the MFC control valve. In setting a desired flow rate from the zero flow rate, the MFC control valve in a full-open state is first closed and then the control valve starts opening to the desired flow rate. However, it takes time to close the control valve because of a pressure difference between the reaction furnace at a low pressure and the control valve. Therefore, the flow has an overshoot in excess of the desired flow rate, making it difficult to control the an oxide film thickness.

In view of this, the MFC control valve is first closed while setting the air valve to be completely closed, and at the same time when the air valve is opened, the MFC control valve starts opening to gradually reach the desired flow rate. In this manner, the flow rate is controlled while avoiding an overshoot. A series of these operations is called a slow start. The $O_2$ purge period Q is set to 10 seconds. At a start time t3 of the purge period Q, a supply of the purge $N_2$ is stopped and a supply of dilute $N_2$ starts by opening the control valve V3 in response to the control signal VC3. A combustion event 3 starts at time t3. When a supply of the purge $N_2$ is stopped, the gas in the combustion chamber is replaced by $O_2$, whereas a supply of the dilute $N_2$ dilutes the gas supplied to the process tube 10.

After a slow start period R of 10 seconds after the end time t4 of the purge period Q, a supply of $H_2$ starts by opening the control valve V1 in response to the control signal VC1. At time t6 after a lapse of 9.9 seconds from the time t5, the lamp heater LH is turned off in response to the control signal LC. Combustion of $H_2$ starts generally at the timing when the hydrogen concentration exceeds a certain value and a certain time lapses. Combustion of $H_2$ can be detected by a flame sensor after the time t6.

A period S of 30 seconds between time t6 and time t7 is provided so as to stabilize the flame. The flow rates of $O_2$ and $H_2$ are set to 3 liters/min. About a half of $O_2$ is consumed by the combustion of $H_2$. Thereafter (after the time t7), the flow rates of $O_2$ and $H_2$ are gradually increased to the preset value necessary for oxidation. At time t8 when the flow rates reach the preset value, the control valve V3 is closed in response to the control signal VC3 so as to stop supplying the dilute $N_2$.

The operations at the periods from the times t1 to t8 will be described in more detail.

Period between times t1 and t2: During this period, combustion is realized by using the lamp heater and heat converging plate (for converging heat of the lamp heater). During this period, the heat converging plate is heated to a temperature necessary for the combustion of a hydrogen gas.

Period between times t2 and t3: During this period, $O_2$ is subjected to the above-described slow start.

Period between times t3 and t4: During this period, the outer gas burner is filled with an $O_2$ gas in order to avoid a danger of explosion of $H_2$ left unburnt when the flow rate of $H_2$ overflows and the $H_2/O_2$ ratio exceeds 2:1.

Period between times t4 and t5: During this period, $H_2$ is subjected to the above-described slow start.

Period between times t5 to t6: In practice, combustion does not start immediately after an $H_2$ gas is introduced, but there is a time delay. During this period, the heat converging plate is further heated in order to provide reliable combustion.

Period between times t6 and t7: During this period, without heating the heat converging plate, combustion is effected by using the remaining heat of the heat converging plate and the flame is brought into a stable state. During this period, water vapor is generated and an oxide film starts being formed. As described above, $H_2$ and $O_2$ are diluted by $N_2$ to lower the partial pressures of $H_2(H_2O)$ and $O_2$. The flow rates are set to a first value lower than the desired value. The combustion timing occurs at any time between the times t6 and t7 by chance.

Period between times t7 and t8: During this period after the flame has been stabilized, the flow rates of $H_2$ and $O_2$ are raised to the desired second value.

With the above-described control sequence, during the period from when the combustion of $H_2$ starts to when the flame is stabilized, the oxidizing gas including water vapor and the like is diluted by $N_2$ supplied from the gas supply pipes 20a and 20b so that the initial oxidation is suppressed. While the partial pressures of oxidizing species such as $H_2O$ are unstable, the initial oxidation is suppressed, and after the flame has been stabilized, the oxidation is allowed to proceed. It is therefore possible to reduce a variation of oxide film thickness. It is also possible to form an oxide film, particularly a very thin oxide film, having a desired thickness with good reproducibility.

It is not preferable to introduce dilute $N_2$ into the external gas burner 14 because the flame becomes less stable. According to the present invention, dilution is effected at the area nearer to the process tube 10 than the external gas burner 14. Therefore, the stability of the flame is not lowered.

If a mixed gas of $O_2$ and $H_2$ is diluted by $N_2$, combustion is not possible. Therefore, combustion of a mixed gas of $O_2$ and $H_2$ is first effected reliably, and then it is diluted by $N_2$ to suppress oxidation.

An oxide film is formed on a bare silicon wafer generally in a short time. There is a belief (assumed from measurement results) that it takes a fourfold time to form an oxide film having a twofold thickness on a silicon film. Therefore, if an oxide film of non-uniform thickness is once formed on a bare silicon wafer, it takes a long time to attain uniformness of an oxide film even when the increased thickness is ignored. If a thin oxide film is to be formed, the initial non-uniform oxidation may become fatal for forming a uniform final oxide film.

Figure 8:
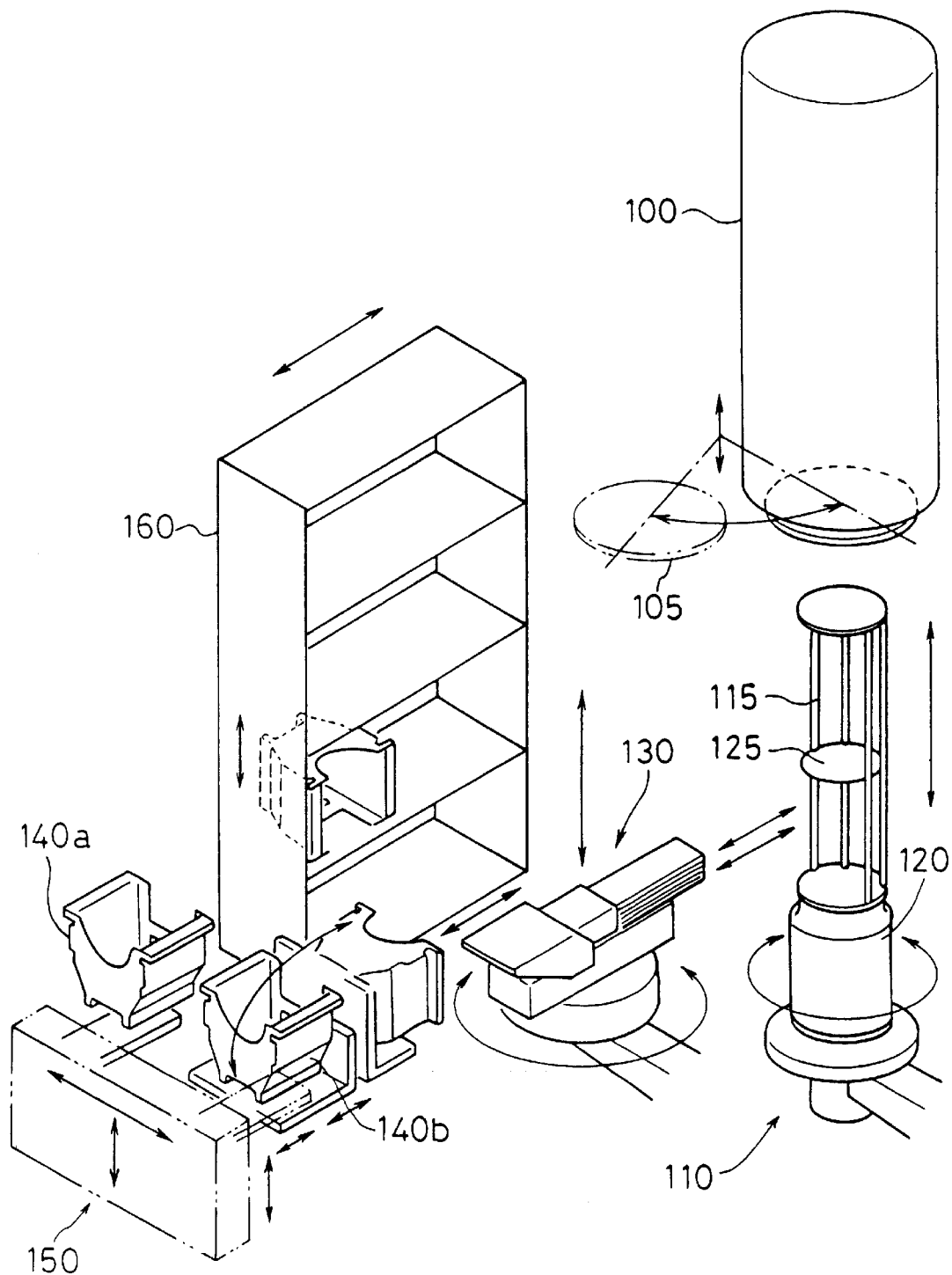
FIG. 8 is a perspective view showing the overall structure of an oxidation process system.

An example of an oxidation process of the embodiment will be described with reference to FIGS. 8 and 9. FIG. 8 is a schematic diagram showing the structure of an oxidation system, and FIG. 9 is a flow chart of an oxidation process.

Referring to FIG. 8, a reaction furnace 100 has an inner heater and is fixed in the vertical direction. An opening of the reaction furnace 100 can be closed by an automatic shutter 105. A boat elevator 110 is inserted into the reaction furnace from the bottom thereof. A wafer holder 115 is mounted on a heat block 120 of the hot elevator 110. The wafer holder 115 is formed with slits which are used for supporting a plurality of wafers.

A carrier transfer 130 transports wafer carriers 140a and 140b between an I/O port 150 and a carrier stage 160, picks up wafers from the carrier stage to load it on the boat elevator, or unloads a wafer from the boat elevator to transfer it to the carrier stage. The reaction furnace is mounted with the above-described gas supply system, external gas burner, and the like.

FIG. 9 illustrates a series of steps of the oxidation process. A symbol "–" in FIG. 9 means "0".

At a boat unload step, a wafer holder is unloaded. Purging the chamber with nitrogen mixed with some oxygen begins at this step.

At a boat cool step, a boat heated to a high temperature is cooled.

At a wafer charge step, wafers are loaded into the boat.

At a boat load step, the wafer loaded boat is placed in the furnace.

At a preheat step, the temperature is raised to a set value and maintained stable. When the wafers are placed in the furnace, the temperature of the furnace lowers. Therefore, at this step, the furnace is preheated for about 30 minutes to raise the temperature to the set value of 800° C. Up to the preheat step inclusive, oxygen gas is made to flow through the chamber to prevent nitriding of the wafer surface.

At a pyrogenic combustion step, an initial oxidation is performed wherein water vapor generated by burning $H_2$ and $O_2$ at the outside of the furnace is exposed to wafers to form uniform oxide films having a target film thickness of 8 nm.

At a wet oxidation step, a mixed gas of $H_2$ and $O_2$ is burnt to generate oxidizing species ($O_2$, water vapor) which are introduced into the furnace to oxidize silicon and form oxide films on the surface thereof at an atmospheric pressure.

At a pyrogenic extinguishment step, combustion for wet oxidation is stopped reliably by first diluting the oxidizing seed gas by $N_2$ and then stopping a supply of $H_2$.

At a post anneal step, annealing after the formation of oxide films is performed to reduce electric charges accumulated in the oxide films (such as fixed charges, interface levels, and charge traps).

At a boat unload step, the boat is unloaded.

At a boat cool step, the boat heated to a high temperature is cooled.

At a wafer discharge step, the wafers are dismounted.

At a boat load step, the boat is returned.

Figure 3:
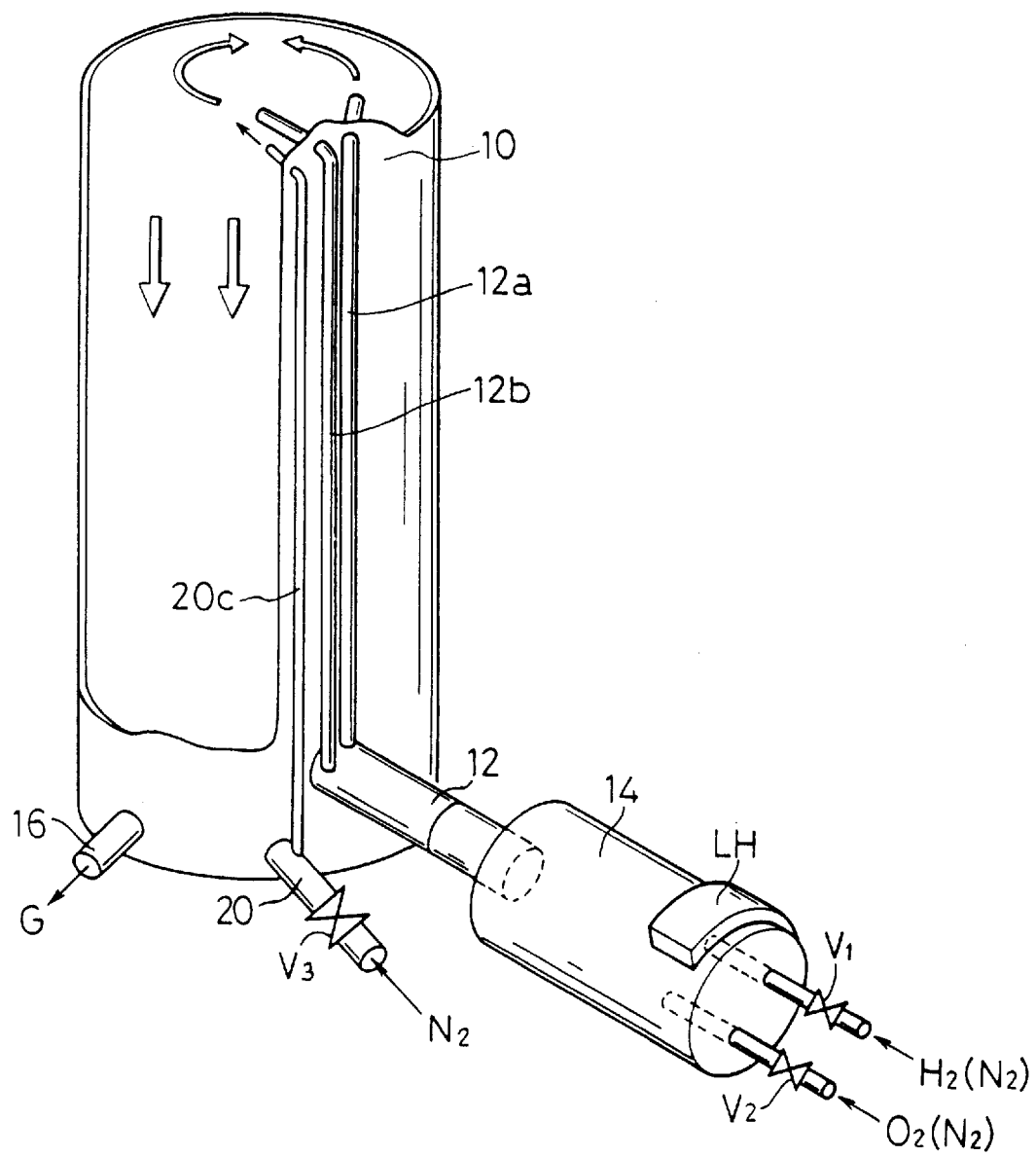
FIG. 3 is a partially broken perspective view of a vertical type heat treatment furnace according to a second embodiment of the invention.

FIG. 3 shows a vertical type heat treatment furnace to be used by the second embodiment of the invention. Like elements to those shown in FIG. 1 are represented by using identical reference numerals, and the detailed description thereof is omitted.

The feature of this heat treatment furnace is that dilute $N_2$ is directly introduced into the upper space of the process tube 10 from a gas supply pipe 20 via a gas supply pipe 20c. The other structures are similar to those shown in FIG. 1. The control sequence is also the same as that described with FIG. 2, providing the same operation and effects of the first embodiment.

It is preferable that the shapes, positions, and the like of the gas supply pipes of this embodiment are designed so as to sufficiently mix the dilute $N_2$ with the oxidizing gas such as $O_2$ and water vapor in the process tube.

Figure 4:
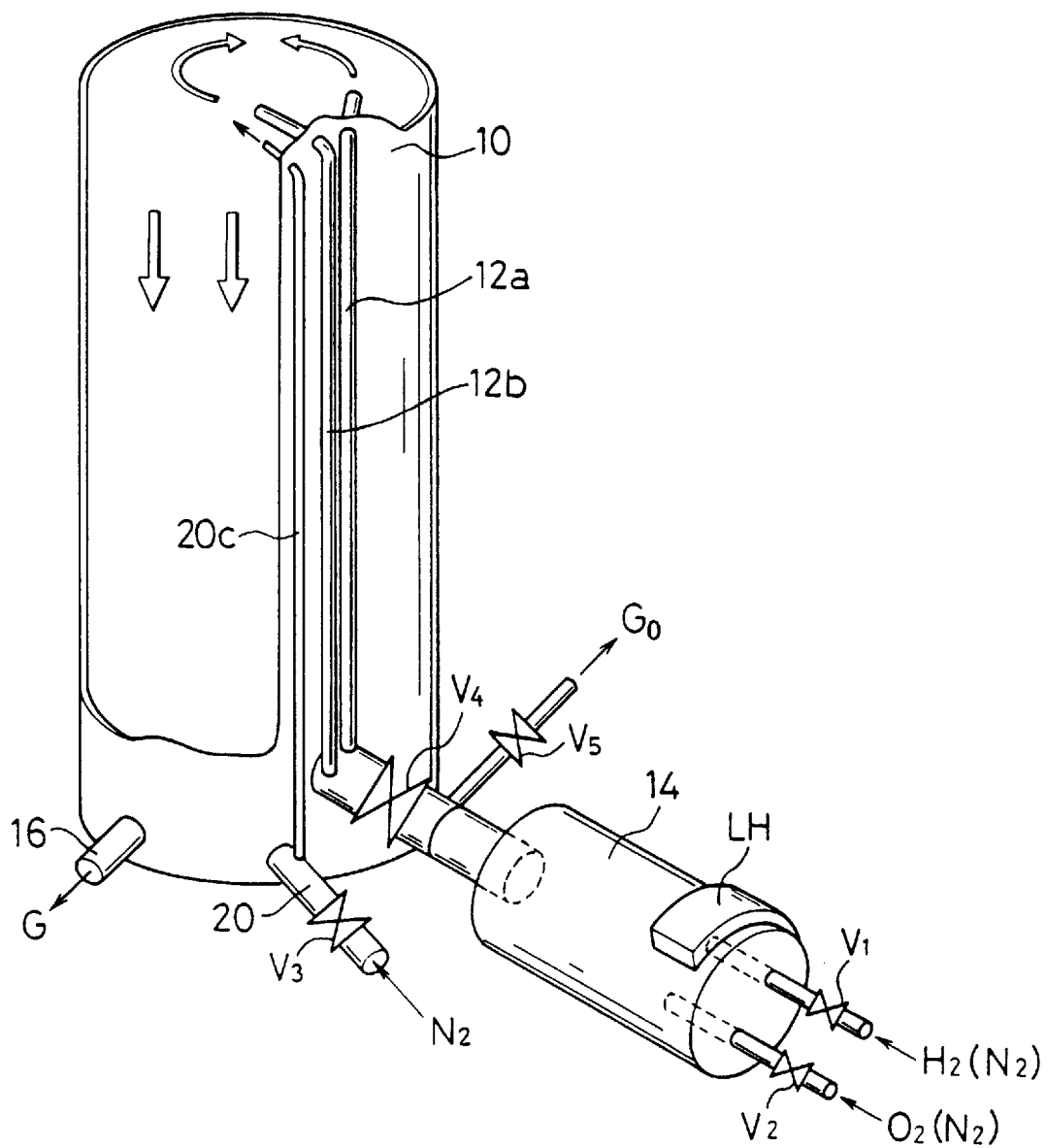
FIG. 4 is a partially broken perspective view of a vertical type heat treatment furnace according to a third embodiment of the invention.

FIG. 4 shows a vertical type heat treatment furnace to be used by the third embodiment of the invention. Like elements to those shown in FIG. 3 are represented by using identical reference numerals, and the detailed description thereof is omitted.

The feature of this heat treatment furnace is that while purging the inside of the process tube 10 by introducing $N_2$ as a non-oxidizing auxiliary purge gas into the upper space of the process tube 10 from a gas supply pipe 20 via a gas supply pipe 20c, the oxidizing gas such as water vapor from the external gas burner 14 is allowed to be bypassed to the exhaust system as an exhaust gas Go under the control of control valves V4 and V5. Thus, no oxidation is allowed to occur when the oxidizing gas is by-passed.

Figure 5:
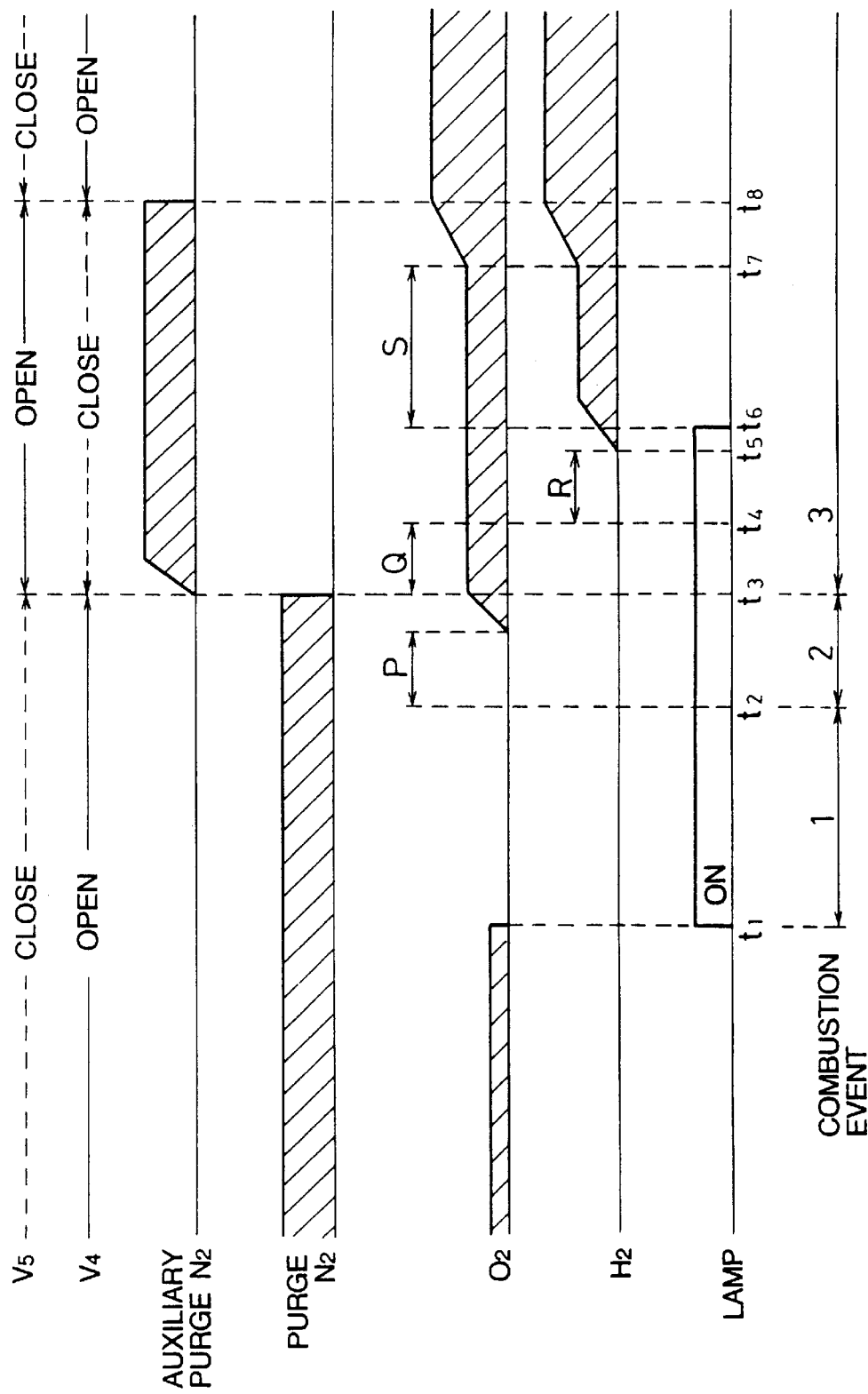
FIG. 5 is a timing chart explaining the control sequence of an oxidation process of the third embodiment.

FIG. 5 shows the control sequence to be used by the furnace shown in FIG. 4. Like parts to those shown in FIG. 2 are represented by using identical reference symbols and terms, and the detailed description thereof is omitted.

Like the dilute gas $N_2$ described above, an auxiliary purge gas $N_2$ is introduced into the upper space of the process tube 10 during the period between times t3 and t8. During the period before the time t3, the control valve V4 is opened and the control valve V5 is closed. In this state, the gas burner is connected to the upstream of the process tube. During the period between the times t3 and t8, the control valve V4 is closed and the control valve V5 is opened so as to bypass the oxidizing gas such as water vapor from the external gas burner 14 to the exhaust system. The gas burner is isolated from the process tube, in this state. During the period after the time t8, the control valve V4 is opened and the control valve V5 is closed. The burner is connected again to the upstream of the process tube, in this state.

As seen from the control sequence shown in FIG. 5, during the period between the times t3 and t8, the inside of the process tube is purged by the auxiliary purge gas $N_2$ and the oxidizing gas such as water vapor is not supplied from the external gas burner 14 to the process tube 10. Therefore, the initial oxidation scarcely progresses, providing more distinct effects of reducing a variation of film thickness than the embodiments shown in FIGS. 1 to 3.

The present invention has been described in connection with the preferred embodiments. The invention is not limited only to the above embodiments. It is apparent to those skilled in the art that various modifications, substitutions, combinations and the like can be made without departing from the scope of the appended claims.

I claim:

1. A furnace for oxidizing semiconductor wafers, said furnace comprising:
    (a) a main furnace for oxidizing semiconductor wafers;
    (b) a sub-reactor connected to the main furnace upstream of said main furnace;
    (c) sources of oxygen gas and hydrogen gas connected to the sub-reactor through a first valve means;
    (d) a source of diluting gas, different from the oxygen gas and the hydrogen gas, connected to the main furnace through a second valve means; and
    (e) a controller for controlling flow rates of the oxygen gas, the hydrogen gas and the diluting gas by adjusting said first and second valve means, wherein the controller generates at least one control signal to at least one of the first and second valve means to introduce the oxygen gas, the hydrogen gas and the diluting gas in such a manner that the oxygen gas and the hydrogen gas are provided into the main furnace through the first valve means and sub-reactor,
    wherein the diluting gas is separately provided into the main furnace through the second valve means,
    wherein combustion of the oxygen gas and the hydrogen gas in the sub-reactor produces a hydrogen flame, and
    wherein the diluting gas is continuously provided at least until the hydrogen flame is stabilized.

2. The furnace of claim 1, wherein the diluting gas is a gas selected from the group consisting of nitrogen, argon and helium.

3. The furnace of claim 1, wherein the controller generates at least one signal to introduce the oxygen gas first, the diluting gas second, and the hydrogen gas last.

4. The furnace of claim 1, including a lamp heater provided with the sub-reactor.

5. The furnace of claim 1, including a pipe connected to the source of said diluting gas to introduce the diluting gas substantially toward a top of the main furnace.

6. The furnace of claim 1, including an exhaust pipe connected to a bottom of the main furnace.

7. The furnace of claim 1, wherein said source of said diluting gas is connected to the main furnace downstream of said sub-reactor.

8. The furnace of claim 1, wherein said oxygen gas, said hydrogen gas and said diluting gas are introduced substantially toward a top of the main furnace.

9. The furnace of claim 1, wherein said sources of said oxygen gas and said hydrogen gas include valves, and said source of diluting gas includes a valve, and said at least one signal generated by said controller controls at least one of said valves of said sources of said oxygen gas, said hydrogen gas and said diluting gas.

10. The furnace of claim 1, including an exhaust pipe connected between said main furnace and said sub-reactor.

11. The furnace of claim 4, wherein said controller generates a signal to control said lamp heater.

12. The furnace of claim 10, including:
    a first valve connected between said exhaust pipe and said main furnace; and
    a second valve connected to said exhaust pipe, wherein said controller generates at least one signal to control at least one of said first and second valves.

13. The furnace of claim 12, wherein said sources of said oxygen gas and said hydrogen gas include valves, and said source of diluting gas includes a valve, and said at least one signal generated by said controller to provide said oxygen gas, said hydrogen gas and said diluting gas controls at least one of sail valves of said sources of said oxygen gas, said hydrogen gas and said diluting gas.

14. The controller of claim 1, wherein the controller automatically generates at least one signal to said sources of said oxygen gas, said hydrogen gas and said diluting gas to introduce the oxygen gas, the hydrogen gas and the diluting gas substantially simultaneously.

15. A furnace for oxidizing semiconductor wafers, said furnace comprising:
    (a) a main furnace for oxidizing semiconductor wafers;
    (b) a sub-reactor connected to the main furnace upstream of said main furnace;
    (c) sources of oxygen gas and hydrogen gas connected to the sub-reactor through a first valve means;
    (d) a source of diluting gas, different from the oxygen gas and the hydrogen gas, connected to the main furnace through a second valve means; and
    (e) a controller for controlling flow rates of the oxygen gas, the hydrogen gas and the diluting gas by adjusting said first and second valve means,
    wherein the controller generates at least one control signal to said sources to introduce the oxygen gas, the hydrogen gas and the diluting gas substantially simultaneously in such a manner that the oxygen gas and the hydrogen gas are provided into the main furnace through the first valve means and sub-reactor,
    wherein the diluting gas is separately provided into the main furnace through the second valve means,
    wherein combustion of the oxygen gas and the hydrogen gas in the sub-reactor produces a hydrogen flame, and
    wherein the diluting gas is continuously provided at least until the hydrogen flame is stabilized.

16. The furnace of claim 15, wherein the diluting gas is a gas selected from the group consisting of nitrogen, argon and helium.

17. The controller of claim 15, wherein the controller automatically generates at least one signal to said sources of said oxygen gas, said hydrogen gas and said diluting gas to introduce the oxygen gas, the hydrogen gas and the diluting gas substantially simultaneously.

18. A furnace for oxidizing semiconductor wafers, said furnace comprising:
    (a) a main furnace for oxidizing semiconductor wafers;
    (b) a sub-reactor connected to the main furnace upstream of said main furnace;
    (c) sources of oxygen gas and hydrogen gas and nitrogen gas connected to the sub-reactor through a first valve means;

(d) a source of diluting gas, different from the oxygen gas and the hydrogen gas, connected to the main furnace through a second valve means; and (e) a controller for controlling flow rates of the oxygen gas, the hydrogen gas, the nitrogen gas and the diluting gas by adjusting said first and second valve means, wherein the controller generates at least one control signal to said sources to introduce the oxygen gas, the hydrogen gas, the nitrogen gas and the diluting gas in such a manner that the oxygen gas and the hydrogen gas are provided into the main furnace through the first valve means and sub-reactor, wherein the diluting gas is separately provided into the main furnace through the second valve means, wherein combustion of the oxygen gas and the hydrogen gas in the sub-reactor produces a hydrogen flame, and wherein the diluting gas is continuously provided at least until the hydrogen flame is stabilized.

19. The furnace of claim 18, wherein the diluting gas is a gas selected from the group consisting of nitrogen, argon and helium.

20. The furnace of claim 18, wherein said oxygen gas, said hydrogen gas, said nitrogen gas and said diluting gas are introduced substantially toward a top of the main furnace.

21. The furnace of claim 18, wherein said sources of said oxygen gas and said hydrogen gas and said nitrogen gas include valves, and said source of diluting gas includes a valve, and said at least one signal generated by said controller controls at least one of said valves of said sources of said oxygen gas, said hydrogen gas, said nitrogen gas and said diluting gas.

22. The furnace of claim 18, wherein the controller generates at least one signal to said sources of said oxygen gas, said hydrogen gas, said nitrogen gas and said diluting gas to introduce the oxygen gas, the hydrogen gas, the nitrogen gas and the diluting gas substantially simultaneously.

23. The controller of claim 18, wherein the controller automatically generates at least one signal to said sources of said oxygen gas, said hydrogen gas and said diluting gas to introduce the oxygen gas, the hydrogen gas and the diluting gas substantially simultaneously.

24. A furnace for oxidizing semiconductor wafers, said furnace comprising:

(a) a main furnace for oxidizing semiconductor wafers;

(b) a sub-reactor connected to the main furnace upstream of said main furnace;

(c) sources of oxygen gas, hydrogen gas and nitrogen gas connected to the sub-reactor through a first valve means;

(d) a source of diluting gas, different from the oxygen gas and the hydrogen gas, connected to the main furnace through a second valve means;

(e) a lamp heater provided with the sub-reactor; and (f) a controller for controlling flow rates of the oxygen gas, the hydrogen gas, the nitrogen gas and the diluting gas by adjusting said first and second valve means, wherein the controller automatically generates at least one control signal to at least one of the first and second valve means of said sources to introduce the oxygen gas, the hydrogen gas and the diluting gas in such a maimer that the oxygen gas and the hydrogen gas are provided into the main furnace through the first valve means and sub-reactor, wherein the diluting gas is separately provided into the main furnace through the second valve means, wherein combustion of the oxygen gas and the hydrogen gas in the sub-reactor produces a hydrogen flame, and wherein the diluting gas is continuously provided at least until the hydrogen flame is stabilized.

25. The furnace of claim 24, wherein the diluting gas is a gas selected from the group consisting of nitrogen, argon and helium.

26. The controller of claim 24, wherein the controller automatically generates at least one signal to said sources of said oxygen gas, said hydrogen gas and said diluting gas to introduce the oxygen gas, the hydrogen gas and the diluting gas substantially simultaneously.

* * * * *